United States Patent
Sahu et al.

(10) Patent No.: US 11,418,187 B1
(45) Date of Patent: Aug. 16, 2022

(54) LOW VOLTAGE POWER ON RESET CIRCUIT

(71) Applicant: Advanced Micro Devices, Inc., Santa Clara, CA (US)

(72) Inventors: Ashish Sahu, Bengaluru (IN); Aniket Bharat Waghide, Chandrapur (IN); Girish Anathahalli Singrigowda, Bangalore (IN); Prasant Kumar Vallur, Telangana (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/486,425

(22) Filed: Sep. 27, 2021

(51) Int. Cl.
| | |
|---|---|
| *H03K 5/22* | (2006.01) |
| *H03K 17/22* | (2006.01) |
| *H03K 5/24* | (2006.01) |
| *H03K 3/3565* | (2006.01) |
| *G06F 1/24* | (2006.01) |
| *G06F 1/28* | (2006.01) |

(52) U.S. Cl.
CPC .............. *H03K 17/223* (2013.01); *G06F 1/24* (2013.01); *G06F 1/28* (2013.01); *H03K 3/3565* (2013.01); *H03K 5/2472* (2013.01)

(58) Field of Classification Search
CPC combination set(s) only.
See application file for complete search history.

(56) References Cited

U.S. PATENT DOCUMENTS

| 10,823,767 B1 * | 11/2020 | Ishida | H03K 5/1252 |
| 2022/0085798 A1 * | 3/2022 | Akahane | H03K 3/027 |

* cited by examiner

*Primary Examiner* — Long Nguyen
(74) *Attorney, Agent, or Firm* — Polansky & Associates, P.L.L.C.; Paul J. Polansky; Nathan H. Calvert

(57) ABSTRACT

A power supply detection circuit for an integrated circuit (IC) includes a reference voltage circuit and a comparator circuit. The reference voltage circuit produces a reference voltage from the supply voltage at a reference voltage node. The comparator circuit includes a first p-type metal oxide semiconductor (PMOS) transistor with a source coupled to a positive supply terminal, a gate receiving the reference voltage, and a drain connected to a comparator output terminal. A first n-type metal oxide semiconductor (NMOS) transistor has a drain connected to the comparator output terminal, a source connected to the negative supply terminal, and a gate receiving a second voltage that varies relative to the supply voltage. A second PMOS transistor has a source coupled to the positive supply terminal, a gate connected to the reference voltage node, and a drain providing the second voltage and coupled to a filter.

20 Claims, 5 Drawing Sheets

LOW VOLTAGE POWER ON RESET CIRCUIT

BACKGROUND

A power-on-reset circuit is used to provide a reset signal to the chip when a voltage supply ramps up so that the chip always initializes in a known state. As new semiconductor technology nodes are developed, the core supply voltage used with those nodes is scaled down. Sensing these lower supply voltages accurately and reliably is a challenge for power-on-reset circuits, because while the supply voltage for prior technology nodes was typically over twice the voltage level of a transistor threshold voltage, in new technology nodes the supply voltage is often only slightly higher than one threshold voltage.

The requirement to detect a supply voltage only slightly higher than a single metal-oxide-semiconductor field effect transistor (MOSFET) threshold voltage has presented challenges for power-on-reset circuit design unlike those seen for earlier technology nodes. When using prior circuit designs to perform such near MOSFET threshold voltage detection, the performance of the power-on-reset circuit's reference generator and comparator cannot be guaranteed across all process and temperature corners. The existing power-on-reset designs also suffer from design complexity, which springs from the requirement that the reference generator and the comparator both need to perform accurately for a very low voltage range. Existing power-on-reset designs also frequently have high power dissipation, which is unsuitable for low power applications.

Figure 1:
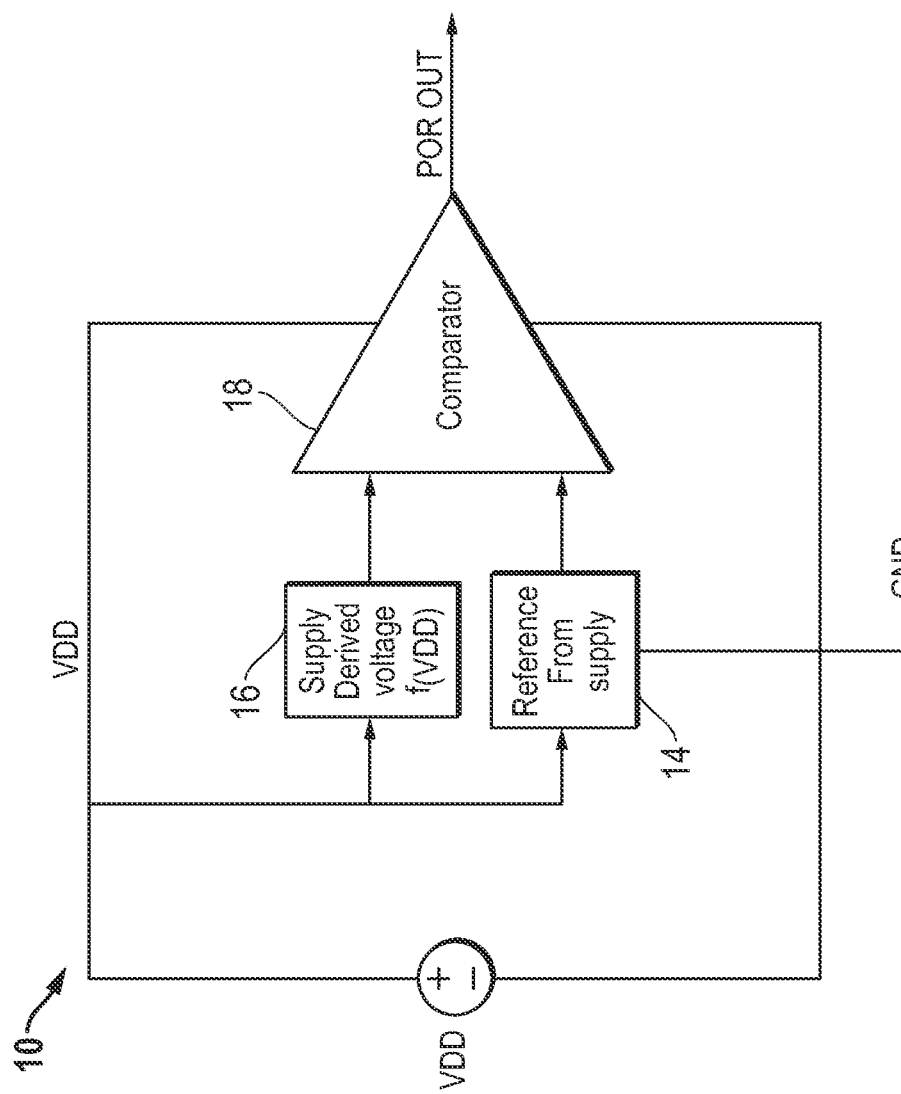
FIG. 1 illustrates in block diagram form a power-on-reset circuit according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a power supply detection circuit for an integrated circuit (IC) includes a reference voltage circuit and a comparator circuit. The reference voltage circuit receives a supply voltage from positive and negative supply terminals and producing a reference voltage at a reference voltage node. The comparator circuit includes a first p-type metal oxide semiconductor (PMOS) transistor with a source connected to the positive supply terminal, a gate connected to the reference voltage node, and a drain connected to a comparator output terminal; a first n-type metal oxide semiconductor (NMOS) transistor with a drain connected to the comparator output terminal, a source connected to the negative supply terminal, and a gate receiving a second voltage that varies relative to the supply voltage; and a second PMOS transistor with a source coupled to the positive supply terminal, a gate connected to the reference voltage node, and a drain providing the second voltage and coupled to the negative supply terminal through a filter circuit.

In another form, an IC includes a plurality of complementary metal-oxide-semiconductor (CMOS) circuits provided a supply voltage through positive and negative supply terminal, and a power-on-reset circuit. The power-on-reset circuit includes a reference voltage circuit and a comparator circuit. The reference voltage circuit is connected between the positive and negative supply terminals and produces a reference voltage at a reference voltage node. The comparator circuit includes PMOS transistor with a source coupled to the supply voltage, a gate connected to the reference voltage node, and a drain connected to an comparator output terminal; a first NMOS transistor with a drain connected to the comparator output terminal, a source connected to the negative supply terminal, and a gate receiving a second voltage that varies relative to the supply voltage; and a second PMOS transistor with a source coupled to the positive supply terminal, a gate connected to the reference voltage node, and a drain providing the second voltage and coupled to the negative supply terminal through a filter circuit.

In still another form, a method is provided for operating an integrated circuit (IC). The method includes creating a reference voltage from a power supply voltage, and creating a second voltage that varies relative to the power supply voltage. Noise is filtered from the second voltage. The method drives a gate of a first p-type metal oxide semiconductor (PMOS) transistor with the reference voltage to pull up a comparator output terminal during a first designated relationship of the reference voltage and the second voltage. The method drives a gate of a first n-type metal oxide semiconductor (NMOS) transistor with the second voltage to pull down the comparator output terminal during a second designated relationship of the reference voltage and the second voltage. A Schmitt trigger is activated by an input connected to the comparator output terminal.

FIG. 1 illustrates in circuit diagram form a power-on-reset (POR) circuit 10 according to the prior art. POR circuit 10 generates a digital reset signal POR OUT with a predetermined delay after the power supply has crossed a certain threshold voltage called the "trip up" voltage. This reset signal is employed to ensure correct initialization of critical nodes in analog and digital circuitry such as registers/latches during the supply ramp-up POR circuit 10 includes a reference voltage circuit 14, a second voltage generation circuit 16, and a comparator 18. Reference voltage circuit 14 generates a reference voltage from a supply voltage VDD. Second voltage generation circuit 16 creates a voltage as a function of the supply voltage VDD as shown by f (VDD). The reference voltage and the second voltage are fed to comparator 18, which transitions to a logical HIGH when the supply voltage VDD rises above a first threshold during supply ramp up, and transitions to a logical LOW when the supply voltage VDD drops below a second threshold during supply ramp down.

A POR circuit similar to POR circuit 10 is often used with 7 nm and larger technology nodes N7. In such designs, reference voltage circuit 14 is typically implemented with a beta multiplier voltage generation circuit to provide supply independent biasing. However, the beta multiplier architecture uses two branches with a PMOS transistor and NMOS transistor connected in series in each branch, requiring a supply voltage much higher than a single transistor threshold voltage. Typically comparator 18 is implemented with an op-amp based comparator circuit. Both the beta multiplier and op-amp comparator consume a relatively large amount of power and do not operate reliably if the VDD level to be detected is lower than two times the transistor threshold voltage.

Figure 2:
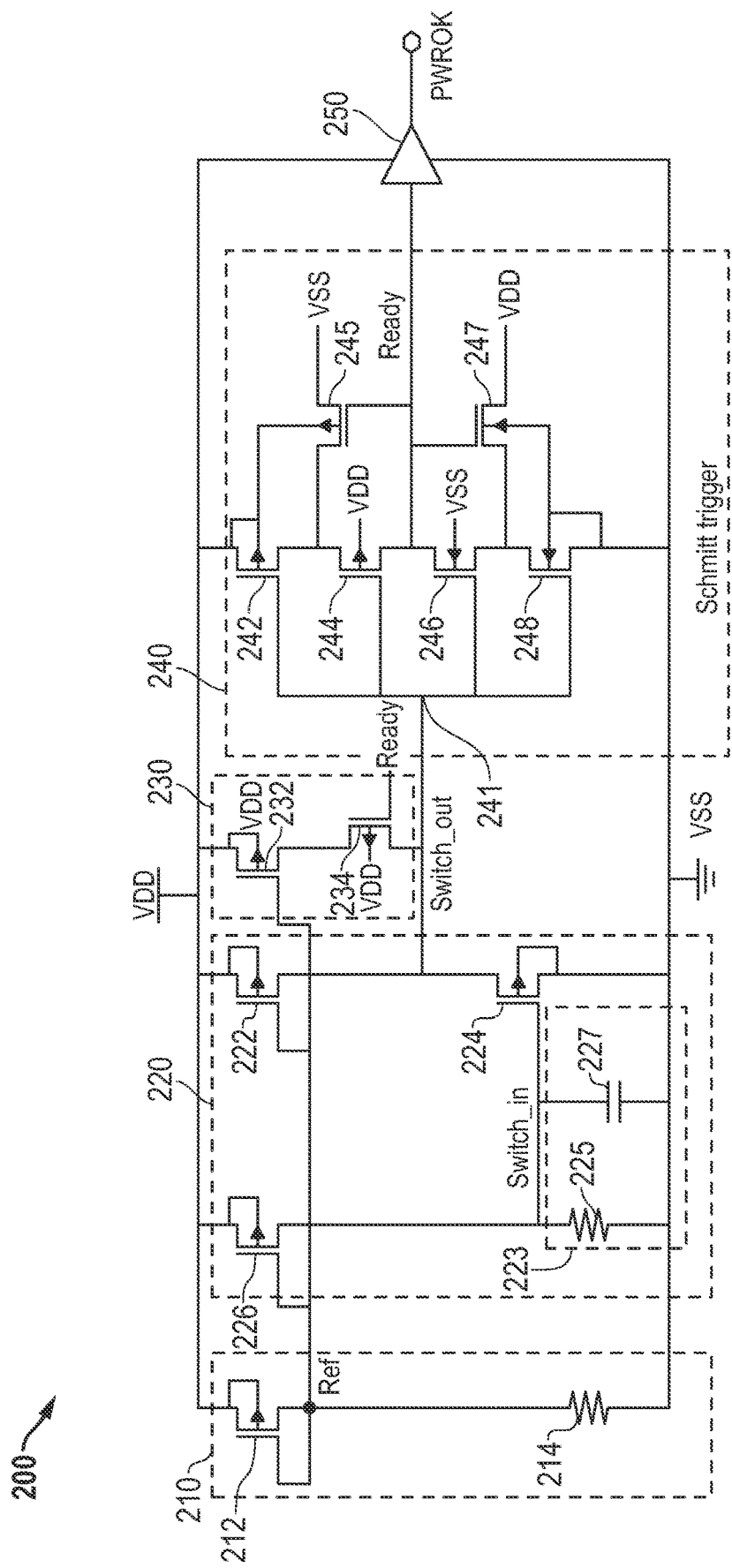
FIG. 2 illustrates in circuit diagram form a power-on-reset circuit according to some embodiments.

FIG. 2 illustrates in circuit diagram form a power-on-reset (POR) circuit 200 according to some embodiments. POR circuit 200 generally includes a reference voltage circuit 210, a comparator circuit 220, a feedback circuit 230, a Schmitt trigger circuit 240, and a buffer 250.

Reference voltage circuit 210 includes a PMOS transistor 212 with a drain and gate connected to a reference voltage node "Ref", a source connected to a positive supply terminal VDD, and a resistor 214 connected between the reference voltage node and a negative supply terminal VSS.

Comparator circuit 220 includes a PMOS transistor 222, an NMOS transistor 224, a second PMOS transistor 226, and a filter circuit 223. PMOS transistor 222 has a source connected to the positive supply terminal VDD, a gate connected to the reference voltage node Ref, and a drain connected to a comparator output terminal "Switch_out". NMOS transistor 224 includes a drain connected to comparator output terminal Switch_out, a source connected to the negative supply terminal of voltage supply VSS, and a gate receiving a second voltage at the depicted node "Switch_in" that varies relative to the supply voltage. As used herein, VDD and VSS can refer either to the respective power supply voltage terminal, or to the voltage conducted on the respective power supply terminal, as indicated by the context. PMOS transistor 226 has a source connected to the positive supply terminal VDD, a gate connected to the reference voltage node ref, and a drain providing the second voltage and coupled to the negative supply terminal VSS through filter circuit 223.

Filter circuit includes a resistor 225 and a capacitor 227. Resistor 225 is connected between the drain of PMOS transistor 226 at node Switch_in and the negative supply terminal VSS. Capacitor 227 is connected in parallel with resistor 225.

Schmitt trigger circuit 240 includes an input terminal 241, PMOS transistors 242, 244, and 245, and NMOS transistors 246, 247, and 248. PMOS transistor 242 has a source connected to positive supply terminal VDD, a gate connected to input terminal 241, and a drain. PMOS transistor 244 has a source connected to the drain of PMOS transistor 242, a gate connected to input terminal 241, and a drain connected to an output terminal labeled "Ready". PMOS transistor 245 has a source connected to the drain of PMOS transistor 242, a gate connected to output terminal Ready, and a drain connected to negative supply terminal VSS. As indicated on the diagram, the bodies of PMOS transistors 242, 244 and 245 are connected to positive supply terminal VDD.

NMOS transistor 248 has a source connected to negative supply terminal VSS, a gate connected to input terminal 241, and a drain. NMOS transistor 246 has a source connected to the drain of NMOS transistor 248, a gate connected to input terminal 241, and a drain connected to output terminal Ready. NMOS transistor 247 has a source connected to the drain of NMOS transistor 248, a gate connected to output terminal Ready, and a drain connected to positive supply terminal VDD. The bodies of NMOS transistors 246, 247, and 248 are connected to negative supply terminal VSS.

Feedback circuit 230 includes a PMOS transistor 232 and a PMOS transistor 234. PMOS transistor 232 has a source connected to positive supply terminal VDD, a gate connected to reference voltage node Ref, and a drain. PMOS transistor 234 has a source connected to the drain of PMOS transistor 232, a gate connected to the Schmitt trigger output terminal Ready, and a drain connected to comparator output terminal Switch_out.

The output terminal Ready of Schmitt trigger circuit 240 is connected to an input of buffer 250. The output terminal of buffer 250 supplies a power okay indication signal "PWROK" to indicate to CMOS circuitry in the host IC that the VDD power supply has risen to a level suitable for use.

In operation, reference voltage circuit 210 receives a supply voltage VDD from positive and negative supply terminals and produces a reference voltage at reference voltage node Ref by providing current through resistor 214. Driving the reference voltage on the gate of PMOS transistor 226 creates a second voltage on node Switch_in that varies relative to the power supply voltage. Noise is filtered from the second voltage by filter 223. By driving the gate of PMOS transistor 222 with the reference voltage, comparator output terminal Switch_out is pulled up to the level of VDD during a first designated relationship of the reference voltage and the second voltage. By driving the gate of NMOS transistor 224 with the second voltage, comparator output terminal Switch_out is pulled down to the level of VSS during a second designated relationship of the reference voltage and the second voltage. Schmitt trigger circuit 240 is activated by the voltage on comparator output terminal Switch_out.

Figure 3:
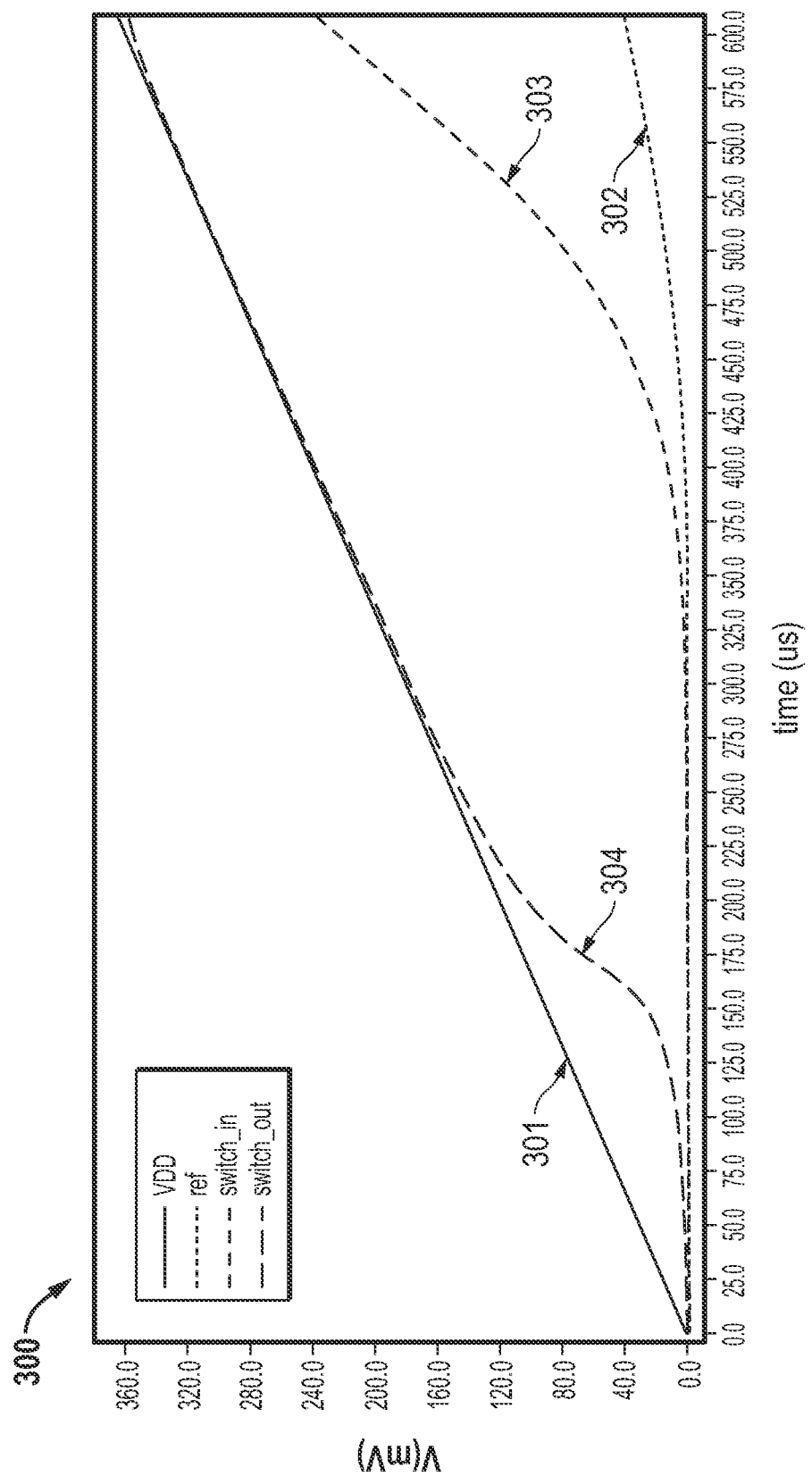
FIG. 3 shows a timing diagram containing plots illustrating the performance of the power-on-reset circuit of FIG. 2.
Figure 4:
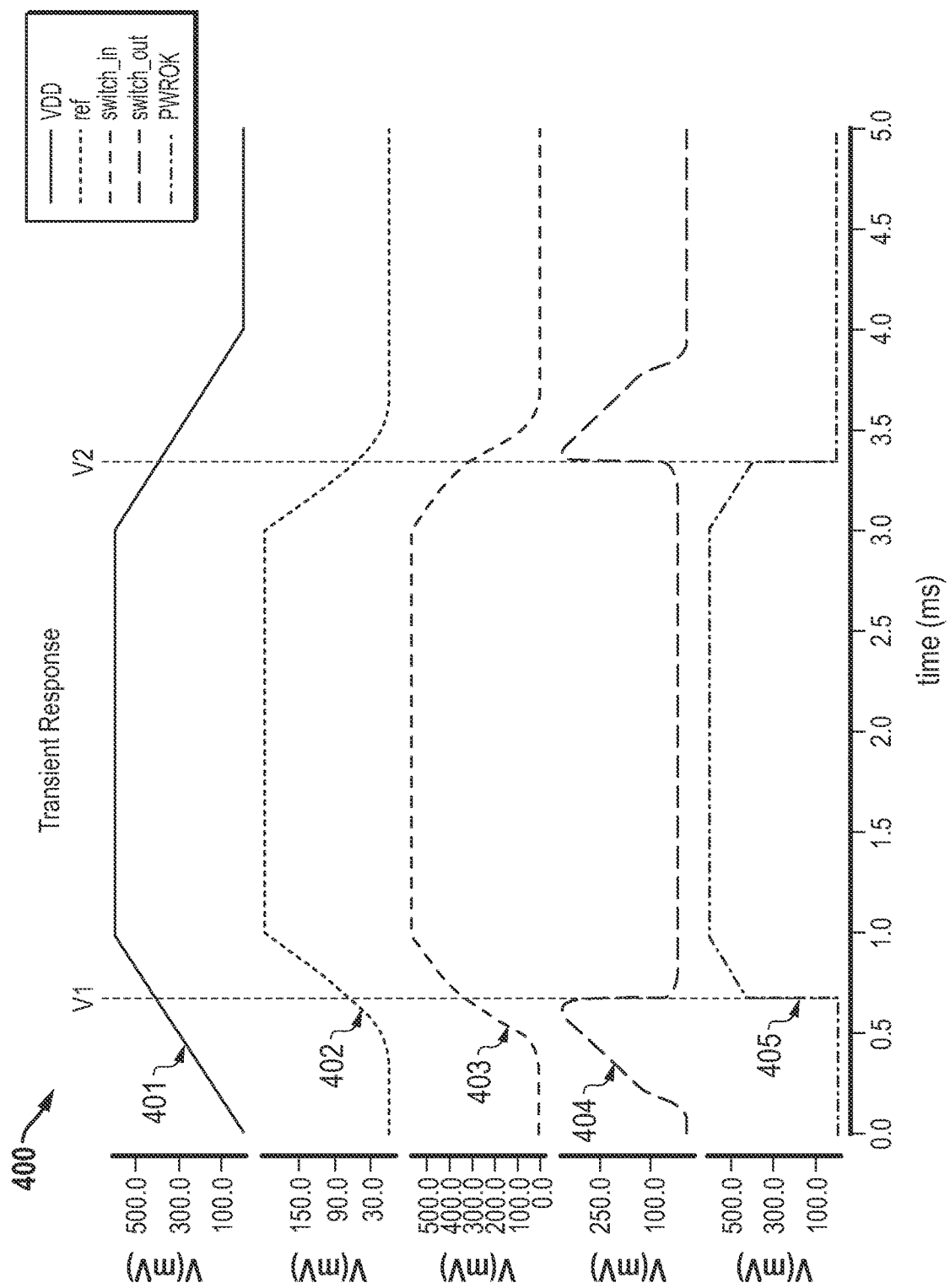
FIG. 4 shows a timing diagram containing plots illustrating the performance of the power-on-reset circuit of FIG. 2.

FIGS. 3-4 show charts of certain signals illustrating the performance of POR circuit 200 of FIG. 2. FIG. 3 shows a chart 300 containing plots of the reference voltage, Switch_in voltage, and Switch_out voltage relative to VDD over time. FIG. 4 shows a chart 400 containing plots of the reference voltage, the Switch_in voltage, the Switch_out voltage, and a power okay indication signal PWROK as VDD rises and falls over time.

Referring to FIG. 2 and also FIGS. 3 and 4, POR circuit 200 starts operating when the supply voltage VDD is ramped up from GND (0V) as shown by plots 301 and 401. As soon as VDD (plots 301 and 401) crosses the threshold voltage $V_T$ of the diode-connected PMOS transistor 212, PMOS transistor 212 enters its saturation region and provides a current through resistor 214. This current creates the reference voltage shown by plots 302 and 402, which drives the gates of PMOS transistors 226, 222, and 232. The reference voltage is proportional to supply voltage VDD once POR circuit 200 reaches a steady state as shown by the flat area in the central part of plot 402.

Similarly, as the supply voltage VDD ramps up, the source-to-gate voltage across the PMOS transistors 226, 222, and 232 also starts to increase. As the source-to-gate voltage $V_{SG}$ of PMOS transistor 226 crosses the threshold voltage $V_T$ of the device, that is, $V_{SG} > |V_T|$, PMOS transistor 226 turns on and a finite current flows through resistor 225. With the increase in the supply voltage VDD, the flow of current in the resistor 225 increases, which increases the second voltage on the node Switch_in as shown by plots 303 and 403. However, the voltage required on the node Switch_in must be greater than the $V_T$ of the NMOS transistor 224 to turn it on, as indicated by Equation 1 below, where $V_{GS(224)}$ is the gate-to-source voltage of NMOS transistor 224, $V_{switch\_in}$ is the voltage on node Switch_in, and $V_{T(224)}$ is the threshold voltage of NMOS transistor 224.

$$V_{GS(224)} = V_{switch\_in} - 0V \geq V_{T(224)} \quad (1)$$

Initially, as NMOS transistor 224 is turned off, the node Switch_out is pulled up by PMOS transistor 222, as shown on plots 304 and 404. As the voltage of node Switch_out increases, it turns on the NMOS devices 246 and 248 of Schmitt trigger 240, which in turn switches the output of Schmitt trigger 240 at the node Ready to 0 V. The node Ready is provided as feedback to the PMOS transistor 234. Hence, as the node Ready is at 0 V, this allows the PMOS devices 232 and 234 to strongly pull up the node Switch_out. This effect ensures that the PWROK signal is clean logic low before the trip point shown at voltage V1 of FIG. 4.

As the supply voltage VDD keeps ramping-up and provides a sufficient $V_{GS}$ across the NMOS transistor 224, transistor 224 turns on and pulls the node Switch_out to logic low, as shown on the plot 404. As the node Switch_out falls, Schmitt trigger 240 detects logic low at its input. The voltage at which PMOS transistors 242 and 244 turn on is the trip point of POR circuit 200. Once the trip point is achieved, the PWROK signal follows the supply VDD as shown on plot 405. The feedback PMOS transistor 234 is turned-off and the node Switch_out is now pulled down strongly with the help of NMOS 224. As a result, the PWROK signal ramps up and follows the supply voltage VDD, and then becomes stable as the supply stabilizes.

The strengths of the PMOS transistors 222, 232 and NMOS transistor 224 determine the trip point of comparator circuit 220. Comparator circuit 220 is followed by Schmitt trigger 240 to make the circuit functionality more immune to noise. Schmitt strigger 240 provides hysteresis, which effectively raises the threshold voltage (or switch point) of the overall POR circuit when a logic low is present and lowers the switch point when logic high is present. Capacitor 227 connected at the node Switch_in functions to filter out supply noise, preventing accidental detection and preventing the propagation of supply noise glitch to the POR circuit output signal, the PWROK signal.

As the supply voltage VDD starts to ramp down, the reference voltage follows the supply, as shown toward the right side of plot 402. The $V_{SG}$ of PMOS transistor 226 decreases and the voltage at the node Switch_in begins to fall. At a certain supply voltage marked as V2 in FIG. 4, the Switch_in voltage is reduced sufficiently to turn off NMOS transistor 224, and PMOS transistor 222 acts as the pass transistor such that the node Switch_out rises and starts following the supply voltage VDD.

With the rise in voltage at the node Switch_out, Schmitt trigger 240 detects the logic high value on its input, i.e. NMOS transistors 248 and 246 turn on. As a result, the output of the PWROK signal is pulled down to logic low as shown toward the right side of plot 405. The voltage level of the supply voltage VDD at which the voltage of node Switch_out is detected as logic high by the Schmitt trigger is the "trip down" point of POR circuit 200.

Once the PWROK signal is pulled down to logic low and the supply is ramping down, the Ready signal at Schmitt trigger 240's output enables the feedback PMOS transistor 234. This increases the pullup strength of the PMOS devices pulling up the node Switch_out, and ensures that Switch_out is strongly held to a higher voltage to keep the PWROK signal to logic low.

Figure 5:
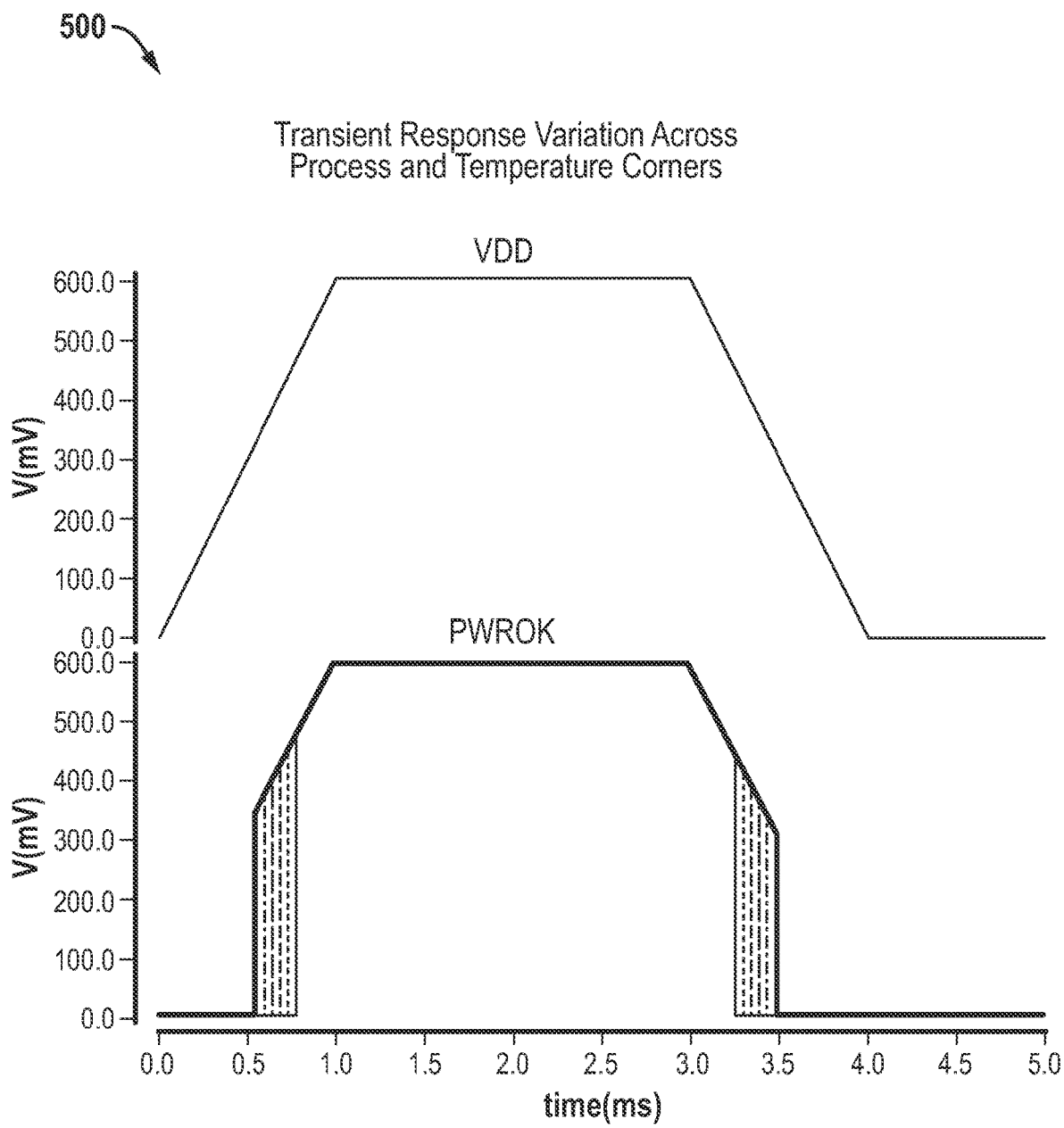
FIG. 5 is a chart showing plots of a power-on-reset circuit output signal across several process and temperature corner conditions.

FIG. 5 is a chart 500 showing plots of the POR circuit output signal PWROK across several process and temperature corner conditions. Chart 500 depicts transient responses of the PWROK signal relative to VDD over time. The depicted results are an implementation of POR circuit 200 with a 5 nanometer production process evaluated across all MOS device process corners, resistor process corners, and temperature corners. Table 1 below summarizes the variation of the trip up threshold used to detect the ramp-up of supply voltage VDD, and the trip down voltage threshold used to detect the ramp-down of supply voltage VDD for POR circuit 200.

TABLE 1

Variation of POR threshold across process and temperature corners

| Parameter | MIN | TYP | MAX | Min Variation % | Max Variation % |
|---|---|---|---|---|---|
| Voltage threshold for VDD ramp-up (mV) | 333.4 | 409.7 | 468 | −19% | 14% |
| Voltage threshold for VDD ramp-down (mV) | 300.4 | 391.3 | 450.5 | −23% | 15% |

As can be seen in FIG. 5, the PWROK plots are grouped tightly together on both the rising and falling edges across process corners. When the PMOS and NMOS transistors of comparator circuit 220 are constructed with a process node of 5 nanometers or smaller, and the comparator circuit is able to cause the comparator output terminal at node Switch_out to be pulled down to indicate detecting that the supply voltage has risen above a designated level at or below 120% of a threshold voltage rating of the PMOS and NMOS transistors, which is typically about 300 mv for a 5 nm process node, but varies according to the particular transistor designs chosen from those available for the process node. In some other embodiments, or in variations due to process corners, this threshold may vary in a range from 118% to 130% of the transistor threshold voltage of the transistors employed in POR circuit 200. The trip down threshold which is used during VDD ramp-down varies in a range of is approximately 4% to 10% lower than the trip up threshold, with the typical value 5% lower than the ramp up threshold. POR circuit 200 is able to achieve stable performance with these threshold levels for 5 nm devices with very low power consumption and process variation. Prior designs such as that in FIG. 1 are not able to function with 5 nm devices rated for 1.5V tolerance and below, while POR circuit 200 performs the power on reset detection function when implemented with such devices.

The circuit of FIG. 2, or portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which synthesizes the description to produce a netlist including a list of gates from a synthesis library. The netlist includes a set of gates that also represent the functionality of the hardware comprising integrated circuits. The netlist is then placed and routed to produce a data set describing geometric shapes to be applied to masks. The masks are then used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, more than two voltage supply levels may be present in a system. The level shifter circuitry described herein may be applied in many situations in which overvoltage protection is desired for shifting voltage levels between voltage domains. The level shifter circuitry herein may be employed for shifting voltage levels from data transmission circuitry external to an IC, within a multi-chip module, or internal data transmission in some situations.

Accordingly, it is intended by the appended claims to cover all modifications of the disclosed embodiments that fall within the scope of the disclosed embodiments.

What is claimed is:

1. A power supply detection circuit for an integrated circuit (IC) comprising:
    a reference voltage circuit receiving a supply voltage from positive and negative supply terminals and producing a reference voltage at a reference voltage node;
    a comparator circuit comprising:
        a first p-type metal oxide semiconductor (PMOS) transistor with a source coupled to the positive supply terminal, a gate connected to the reference voltage node, and a drain connected to a comparator output terminal (switch_out);
        a first n-type metal oxide semiconductor (NMOS) transistor with a drain connected to the comparator output terminal, a source connected to the negative supply terminal, and a gate receiving a second voltage (Switch_in) that varies relative to the supply voltage; and
        a second PMOS transistor with a source coupled to the positive supply terminal, a gate connected to the reference voltage node, and a drain providing the second voltage and coupled to the negative supply terminal through a filter circuit.

2. The power supply detection circuit of claim 1, further comprising a Schmitt trigger circuit including an input connected to the comparator output terminal.

3. The power supply detection circuit of claim 2, further comprising a feedback circuit including:
    a third PMOS transistor with a source coupled to the positive supply terminal, a drain terminal, and a gate receiving the reference voltage; and
    a fourth PMOS transistor with a source connected to the drain of the third PMOS transistor, a drain connected to the comparator output terminal, and a gate connected to an output of the Schmitt trigger circuit.

4. The power supply detection circuit of claim 1, wherein the filter circuit comprises a resistor and a capacitor in parallel coupling the drain of the second PMOS transistor to the negative supply terminal.

5. The power supply detection circuit of claim 1, wherein the reference voltage circuit comprises a p-type metal oxide semiconductor (PMOS) transistor with a drain and gate connected to a reference voltage node, a source connected to the positive supply terminal, and a first resistor coupled between the reference voltage node and the negative supply terminal.

6. The power supply detection circuit of claim 1, wherein the PMOS and NMOS transistors are constructed with a process node capable of supporting a gate length of 5 nanometers or smaller, and the comparator circuit causes the comparator output terminal to be pulled down to indicate that the supply voltage has risen above a first threshold level.

7. The power supply detection circuit of claim 6, wherein the first and second PMOS transistors and the NMOS transistor are constructed with a process node capable of supporting a gate length of 5 nanometers or smaller, and the comparator circuit causes the comparator output terminal to be pulled up to indicate detecting that the supply voltage has fallen below a second threshold level lower than the first threshold level.

8. The power supply detection circuit of claim 1, wherein the PMOS and NMOS transistors are constructed with a process node of 5 nanometers or smaller, and the comparator circuit causes the comparator output terminal to be pulled down to indicate detecting the supply voltage has risen above a designated level at or below 120% of a threshold voltage rating of the PMOS and NMOS transistors.

9. An integrated circuit (IC) comprising:
    a plurality of complementary metal-oxide-semiconductor (CMOS) circuits provided a supply voltage through positive and negative supply terminals; and
    a power-on-reset circuit comprising:
        a reference voltage circuit connected between the positive and negative supply terminals and producing a reference voltage at a reference voltage node; and
        a comparator circuit comprising:
            a first p-type metal oxide semiconductor (PMOS) transistor with a source coupled to the supply voltage, a gate connected to the reference voltage node, and a drain connected to an comparator output terminal;
            a first n-type metal oxide semiconductor (NMOS) transistor with a drain connected to the comparator output terminal, a source connected to the negative supply terminal, and a gate receiving a second voltage that varies relative to the supply voltage; and
            a second PMOS transistor with a source coupled to the positive supply terminal, a gate connected to the reference voltage node, and a drain providing the second voltage and coupled to the negative supply terminal through a filter circuit.

10. The IC of claim 9, further comprising a Schmitt trigger circuit including an input connected to the comparator output terminal.

11. The IC of claim 10, further comprising a feedback circuit including:
    a third PMOS transistor with a source coupled to the positive supply terminal, a drain terminal, and a gate receiving the reference voltage; and
    a fourth PMOS transistor with a source connected to the drain of the third PMOS transistor, a drain connected to the comparator output terminal, and a gate connected to an output of the Schmitt trigger circuit.

12. The IC of claim 9, wherein the filter circuit comprises a resistor and a capacitor in parallel coupling the drain of the second PMOS transistor to the negative supply terminal.

13. The IC of claim 9, wherein the reference voltage circuit comprises a p-type metal oxide semiconductor (PMOS) transistor with a drain and gate connected to a reference voltage node, a source connected to a positive voltage supply terminal, and a first resistor coupled between the reference voltage node and the negative supply terminal.

14. The IC of claim 9, wherein the PMOS and NMOS transistors are constructed with a process node capable of supporting a gate length of 5 nanometers or smaller, and the comparator circuit causes the comparator output terminal to be pulled down to indicate detecting that the supply voltage has risen above a designated level at or below 468 mv.

15. The IC of claim 14, wherein the PMOS and NMOS transistors are constructed with a process node of 5 nanometers or smaller, and the comparator circuit causes the comparator output terminal to be pulled up to indicate detecting that the supply voltage has fallen below a designated level at or below 450.5 mv.

16. The IC of claim 9, wherein the PMOS and NMOS transistors are constructed with a process node of 5 nanometers or smaller, and the comparator circuit causes the comparator output terminal to be pulled down to indicate detecting that the supply voltage has risen above a designated level at or below 120% of a threshold voltage rating of the PMOS and NMOS transistors.

17. A method of operating an integrated circuit (IC) comprising:
creating a reference voltage from a power supply voltage;
creating a second voltage (Switch_in) that varies relative to the power supply voltage;
filtering noise from the second voltage;
driving a gate of a first p-type metal oxide semiconductor (PMOS) transistor with the reference voltage to pull up a comparator output terminal during a first designated relationship of the reference voltage and the second voltage;
driving a gate of a first n-type metal oxide semiconductor (NMOS) transistor with the second voltage to pull down the comparator output terminal during a second designated relationship of the reference voltage and the second voltage; and
activating a Schmitt trigger with an input connected to the comparator output terminal.

18. The method of claim 17, wherein creating the second voltage comprises driving a gate of a second PMOS transistor with the reference voltage, providing the power supply voltage to a source of the second PMOS transistor, and providing the second voltage at a drain of the second PMOS transistor.

19. The method of claim 18, wherein creating the reference voltage is performed with a PMOS transistor including a drain and gate connected to a reference voltage node, a source receiving the power supply voltage, and a first resistor coupled between the reference voltage node and a negative supply terminal.

20. The method of claim 17, wherein the PMOS and NMOS transistors are constructed with a process node capable of supporting a gate length of 5 nanometers or smaller, and wherein the comparator output terminal is pulled down when the power supply voltage has risen above a designated level at or below 120% of a threshold voltage rating of the PMOS and NMOS transistors.

* * * * *